United States Patent [19]
Koh et al.

[11] Patent Number: 5,878,053
[45] Date of Patent: Mar. 2, 1999

[54] HIERARCHIAL POWER NETWORK SIMULATION AND ANALYSIS TOOL FOR RELIABILITY TESTING OF DEEP SUBMICRON IC DESIGNS

[75] Inventors: Han Young Koh, Fremont; Jeh-Fu Tuan, San Jose; Tak K. Young, Cupertino; Chiping Ju, Saratoga; Hurley H. Song, San Jose, all of Calif.

[73] Assignee: Synopsys, Inc., Mountain View, Calif.

[21] Appl. No.: 871,086

[22] Filed: Jun. 9, 1997

[51] Int. Cl.[6] .................................................. G06F 11/00
[52] U.S. Cl. ............................................................ 371/22.1
[58] Field of Search .................................. 371/22.1, 22.5, 371/22.6, 24, 25.1, 27.5, 28; 365/201; 395/183.13, 183.16

[56] References Cited

U.S. PATENT DOCUMENTS 5,585,765   12/1996   O'Shaughnessy ........................... 331/1
5,592,118   1/1997    Wilmot et al. ........................... 327/440

*Primary Examiner*—Vincent P. Canney
*Attorney, Agent, or Firm*—Wagner,Murabito&Hao

[57] ABSTRACT

The present invention pertains to a method for analyzing a semiconductor chip design for determining potential voltage drop and electromigration problems. Initially, the semiconductor chip design is divided into a plurality of blocks. A block level verification is then performed based on the assumption that full voltage is being supplied to each of the blocks. Next, the blocks are modeled by an equivalent RC network. This RC network is then reduced into a simpler representation. The voltage drops are determined based on the reduced, equivalent model. The blocks are then reanalyzed with the supply voltage input to the blocks reduced according to the calculated voltage drops. Thereby, a more realistic simulation can be achieved.

22 Claims, 11 Drawing Sheets

HIERARCHIAL POWER NETWORK SIMULATION AND ANALYSIS TOOL FOR RELIABILITY TESTING OF DEEP SUBMICRON IC DESIGNS

FIELD OF THE INVENTION

The present invention relates to a power network simulation and analysis tool for testing the reliability of the physical designs of integrated circuit semiconductor chips.

BACKGROUND OF THE INVENTION

A highly specialized field, commonly referred to as "electronic design automation" (EDA), has evolved to handle the demanding and complicated task of designing semiconductor chips. In EDA, computers are extensively used to automate the design process. Computers are ideally suited to performing tasks associated with the design process because computers can be programmed to reduce or decompose large, complicated circuits into a multitude of much simpler functions. Thereupon, the computers can be programmed to iteratively solve these much simpler functions. Indeed, it has now come to the point where the design process has become so overwhelming that the next generation of integrated circuit (IC) chips cannot be designed without the help of computer-aided design (CAD) systems.

And after the circuit for a new semiconductor chip has been designed and physically laid out, there still remains extensive testing which must be performed to verify that this new design and layout works properly. A multitude of different combinations of test vectors are applied as inputs to the design in order to check that the outputs are correct. In the past, many prior art testing and reliability tools assumed a constant power supply voltage source. This approach was deficient because although the design might be functioning perfectly from a logic standpoint, it might, nevertheless, still not meet specifications due to hidden voltage drop and electromigration problems in interconnect wires. In real life, each of the transistors of a semiconductor circuit consumes a small amount of power (during the logic switching period.). Individually, the voltage drop in the power network attributable to a single transistor is negligible. However, due to rapid advances in semiconductor technology, today's chips can contain upwards of ten million or more transistors. The cumulative effect of all these voltage drops may lead to serious performance degradation or even critical failures. For example, a transistor might be specified to be a logic "0" from 0.0 to 0.7 volts and to be a logic "1" from 3.3 to 2.1 volts. However, due to the voltage drops in the power network, a transistor output might not switch to those specified ranges and thus results in a logic error. And even if a voltage-tolerant CMOS process is used whereby the transistor has more noise margin, its switching speed is detrimentally impacted. Higher power supply voltages makes transistors switch faster, whereas lower voltages makes them switch slower. Consequently, if the voltage in a power network of a circuit drops below a critical level, the speed of that circuit might be reduced to an unacceptable rate.

Another problem which might arise relates to electromigration. It has been established that high current density can cause the metal in the lines distributing the power through the semiconductor chip to migrate along the path of the current flow. Eventually, over a period of time (e.g., several years), this electromigration can result in an open circuit so that power is cut off from parts of the IC, thereby causing the IC to fail. The electromigration may even result in a short circuit which also causes the IC to fail.

Thus, it would be prudent to test for any potential power distribution problems as part of the overall testing and simulation process. However, testing a circuit with millions of transistors is an extremely complex and time-consuming process. It requires expert knowledge and highly skilled EDA specialists. Furthermore, it requires the dedication of a powerful and expensive mainframe computer with gigabytes of memory. Indeed, advances in semiconductor technology has led to submicron designs having even greater numbers of transistors being crammed into ever greater densities at higher levels of complexities which threaten the capability of today's most powerful computers to simulate.

Thus, there exists a need in the prior art for some reliability analysis tool to test and simulate gigantic power network of multi-million transistor submicron IC designs. The present invention provides a unique, efficient solution by implementing a hierarchical scheme. Basically, the present invention extracts an accurate; yet reduced RC model of the power network and current characteristics for each circuit block in the design layout file and then simulates the entire power network of the design with those derived models to determine the current flow and voltage drops in each interconnect wire in the entire circuit at each instance of time, that would otherwise be impossible to simulate due to the prohibitively large memory and CPU time requirement when tried with a conventional flat simulation method. Based on this transistor level simulation, circuit designers can pinpoint where voltage drop and electromigration may pose problems. The designers may then take corrective action before chips are fabricated and sold.

SUMMARY OF THE INVENTION

The present invention pertains to a reliability analysis tool to test and simulate the power network of submicron IC designs. A hierarchical approach incorporating four stages is applied: block level verification, modeling, full chip simulation, and revisiting the blocks. In the block level verification stage, rather than analyzing the entire chip at once, the new chip design is divided into a number of blocks at the top level. The layout of each block matches that of the schematic. The power connection locations of each block are identified in the chip layout. These blocks are then analyzed for voltage drop and electromigration with the assumption that the full voltage levels are being supplied at each power connection point. Any problems detected during the analysis are connected and the blocks are reanalyzed as necessary. Next, in the modeling stage, the power network in each of the blocks is modeled as equivalent RC network. Current characteristics at each power connection point are also modeled as a piece wise linear function. These RC networks are then further reduced into much simpler circuits, which can be analyzed more easily, efficiently and quickly. The actual voltage drops and current waveforms through the top-level interconnect wires are then determined in the full chip RC network simulation stage based on the functionally equivalent, but reduced RC networks and the recorded current models. Once the actual voltage drops and current flows through the interconnect wires have been determined, the last stage is to revisit the blocks with this new information. Instead of assuming that the full supply voltage is being supplied to the blocks, the actual calculated voltage drops are substituted thereto as inputs to the various blocks. The blocks are then re-analyzed with the updated voltage and current values to determine whether there may exist any potential voltage, current, thermal, or electromigration problems with any nodes or wires of the new design.

BRIEF DESCRIPTION OF THE DRAWINGS

The operation of this invention can be best visualized by reference to the drawings.

DETAILED DESCRIPTION

A reliability analysis tool for testing and simulating the power network of submicron IC designs is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1:
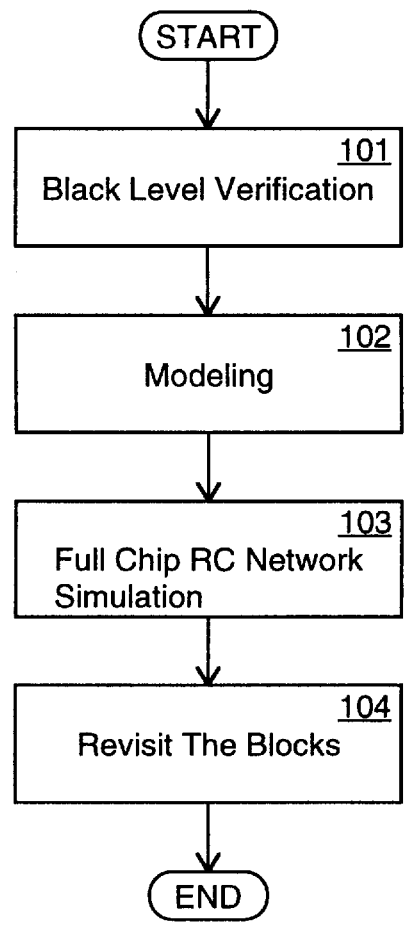
FIG. 1 shows a flowchart describing the basic stages of the present invention.

Referring now to FIG. 1, a flowchart describing the basic stages of the present invention is shown. Rather than simulating and analyzing all of the chip's transistors and parasitic resistors and capacitors originating from the interconnect wires at the same time, the present invention performs the simulation and analysis in four basic stages 101–104. In the first stage 101, the semiconductor chip is broken into several top level blocks, with each block having four million or less transistors. Since the values of the voltage drops to the power connection points have not been calculated, it is assumed at this point that there are no voltage drops. A block level verification is then performed on each of these blocks. Next, stage 102 models the power RC networks of these blocks with simplified, equivalent circuits. The simplified circuits are electrically the same as actual circuits of the blocks that they represent, except that the total number of components (resistors and capacitors) have been reduced. This reduction makes it easier to analyze the RC networks of the blocks. Thereupon, a full chip RC network simulation can be performed in stage 103. Based on this simulation, the voltage drops corresponding to each of the blocks can now be more easily determined. In the last stage 104, the blocks are then revisited (e.g., simulated and analyzed) with the calculated voltage drops and current in flows.

Figure 2:
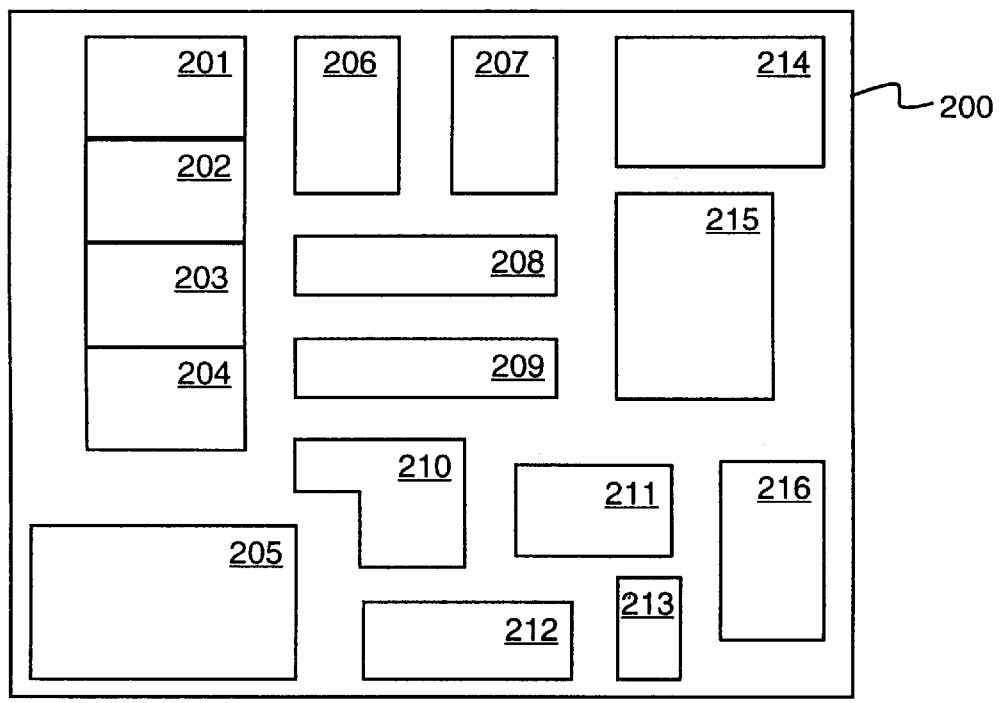
FIG. 2 shows a semiconductor chip which may be tested and simulated by the present invention.

FIG. 2 shows a ten million transistor semiconductor chip 200 as which may be tested and simulated by the present invention. The circuits inside chip 200 are broken into sixteen separate blocks 201–216. The functions of each of the four stages are now described in detail with reference to semiconductor chip 200.

Figure 3:
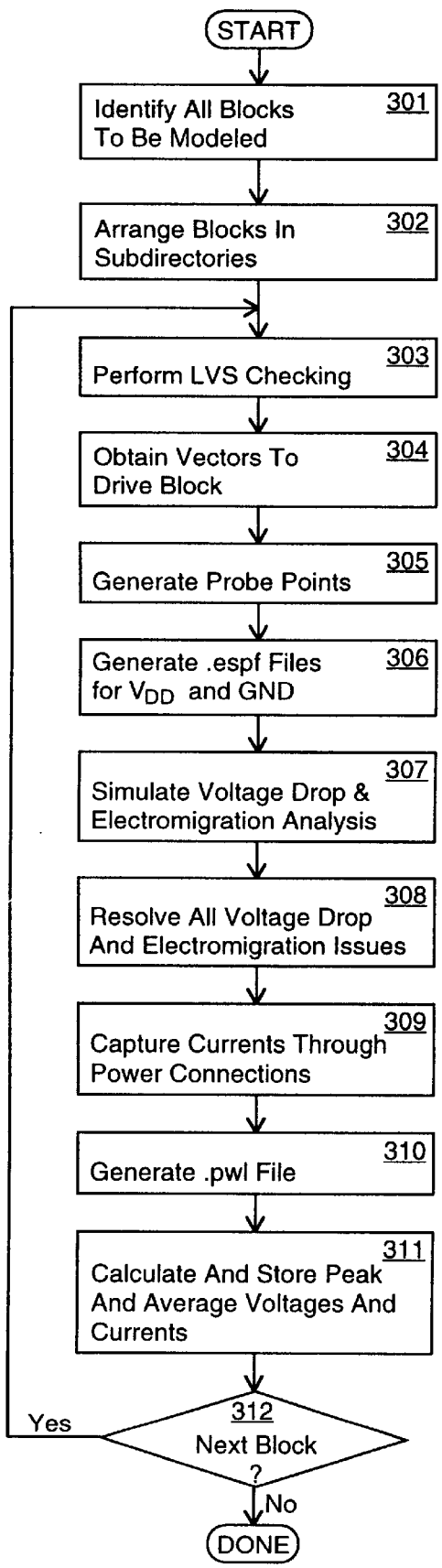
FIG. 3 is a flowchart describing in detail, the steps for performing the block level verification.
Figure 4:
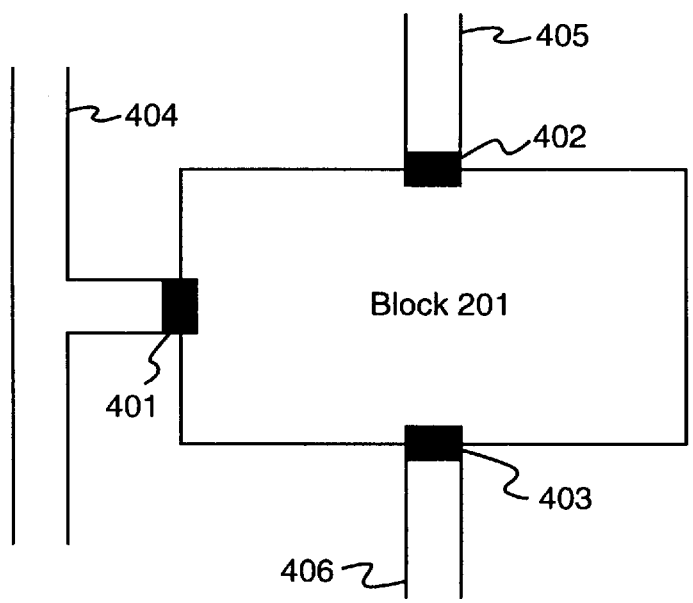
FIG. 4 shows an exemplary block having three probe points with power lines supplying power to the block.

In particular, FIG. 3 is a flowchart describing in detail, the steps for performing the block level verification. In the first step 301, all of the blocks 201–216 which are to be modeled are identified. Note that not each and every block has to be modeled in this fashion. Next, the blocks 201–216 are arranged in step 302 into subdirectories of the circuit directory. All the blocks and the top level should be in parallel directories. For each block, steps 303–310 are performed. In step 303, the layout versus schematic (LVS) checking is performed to ensure that the layout of each block matches with that of the schematic. The test vectors for driving the blocks from the top level are then obtained, step 304. The probe points corresponding to each of the power connection points are generated in step 305. A probe point corresponds to the physical location (x, y) at which power is supplied to a block. A block may have one or more probe points. An example of three probe points 401–403 for power lines 404–406 supplying power to block 201 is shown in FIG. 4.

The next step 306 involves performing an RC extraction to determine the equivalent RC networks of the interconnect wires. For example, a metal line may be represented with its equivalent resistance, which is a function of its length, width, and intrinsic properties. There are many different tools which are commercially available for RC extraction. In the currently preferred embodiment, the RC extraction is performed by a tool Arcadia sold by Synopsys, Inc. of Mountain View, Calif. This particular tool generates an .espf file for RC networks to VDD and GND. Based on this RC network, the voltages at the nodes and branch currents can be calculated using well-known electrical principles. Once the voltages and currents are determined, an approximate simulation of voltage drop and electromigration analysis can be created at step 307. Based on this simulation, potential problem areas are isolated. For example, the voltage drop at a particular node may be too much or the current density through one path may be too high. The user may choose in step 308 to resolve potential voltage drop and electromigration issues by tweaking the design or layout.

Figure 5:
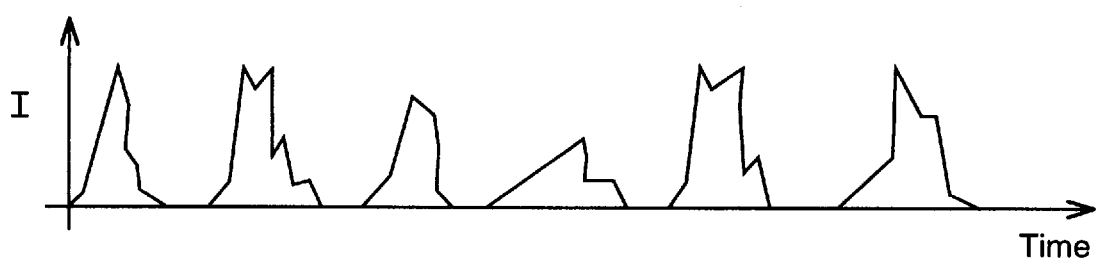
FIG. 5 shows an exemplary current profile flowing through a dynamic power connection as determined by the test vectors.

Next, the currents through the power connections or "pads" (e.g., probe points 401–403) are captured with a "power" configuration command, step 309. Finally, step 310 generates a file (e.g., piece-wise linear---.pwl), to store all the pad current waveforms for the block as a function of time. At each instant in time, the currents through a pad are recorded and a running average is calculated. After some duration of time, a sample current waveform can be constructed. In the currently preferred embodiment, these steps are accomplished through the use of an "em_make_pad_ipwl" command to generate the .pwl file. During block level simulation, the em_make_pad_ipwl function records a piece-wise linear current waveform for each power connection point in the block. FIG. 5 shows an exemplary current profile flowing through a dynamic power connection as determined by the test vectors. It can be seen that the current fluctuates as a function of the switching states of the transistors coupled to that particular power connection. In step 311, the program stores all the peak voltage drops for each pad and the average current flowing through each branch in the power network. In the currently preferred embodiment, this step is accomplished through an "em_vector_compaction" command, which compares all the voltage drops calculated for that node to find the largest voltage drop. For example, one set of test vectors might result in a voltage drop of only 0.2 volts, whereas another set of test vectors might result in a higher voltage drop of 0.7 volts. Similarly, the em_vector_compaction command averages all the current values over some period of time.

This information is stored in separate files (e.g., VDD.ave, VDD.vec, GND.ave, and GND.vec). Step 312 determines whether all designated blocks have been verified. If so, the block verification stage 101 is completed. Otherwise, steps 303–311 are repeated for subsequent designated blocks. It should be noted that each block can be analyzed whenever the design of the block is finished.

Figure 6:
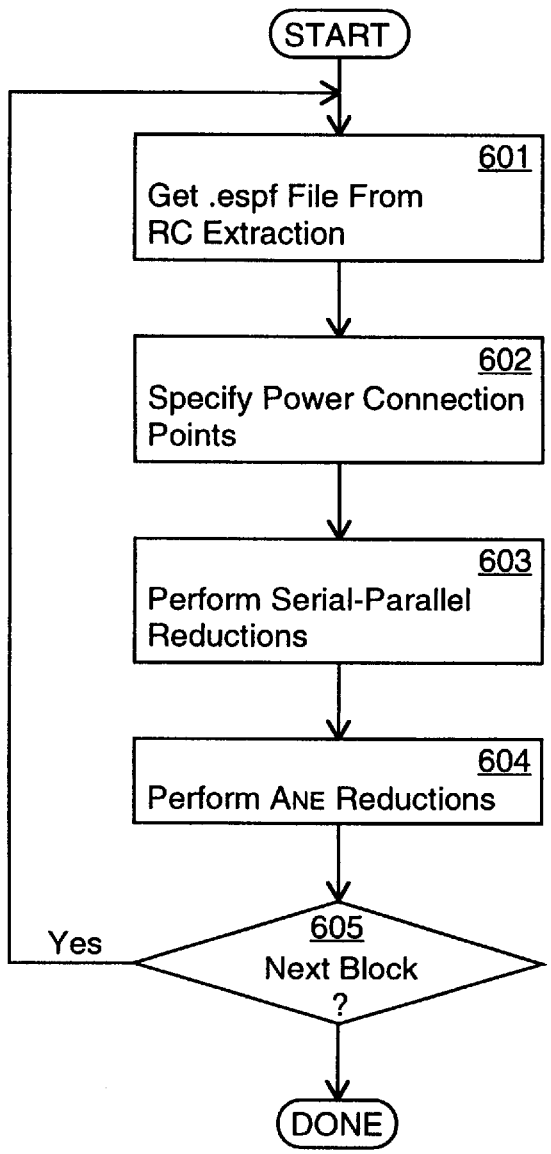
FIG. 6 shows a flowchart describing in detail, the steps for modeling the blocks.
Figure 7:
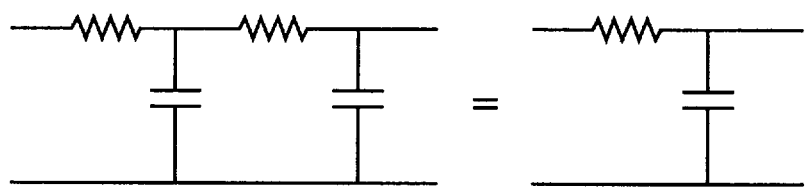
FIG. 7 shows a simple example of how an RC circuit can be reduced.

FIG. 6 shows a flowchart describing in detail, the steps for modeling the blocks. The goal of this stage 102 is to reduce the extracted RC networks (stored as an .espf file) for the blocks to equivalent connectivity and impedance models. In step 601, an .espf file is created from performing an RC extraction. Next, the power connection points are specified, step 602. The reduction is accomplished in part by first performing serial and/or parallel reductions in step 603. The principles behind the reductions are well known in the art. For example, FIG. 7 shows an equivalent circuit for a simple case of an resistor/capacitor (RC) circuit reduction. By iteratively reducing the resistors, inductors, and capacitors (RLCs), a complex circuit can be reduced into simpler circuits that is electrically equivalent to the original circuit. In the currently preferred embodiment, step 603 is accomplished by running an "em_list_espf_file reduction" command to generate an .spi file containing the equivalent circuit having serial/parallel reductions. Further reductions are possible in step 604 by applying commercially available reduction tools. One such tool is the AWE product, manufactured and sold by Synopsis Inc. of Mountain View, Calif. The "make_awe" program can reduce a typical circuit by a factor of ten. The resulting reduced, equivalent circuit is stored in an .awl file. The power connection points were preserved during step 310 (see FIG. 3). In the currently preferred embodiment, they are specified as probe$_{13}$ points by the em_add_pad comment. Step 605 ensures that steps 601–604 are repeated for each of the blocks.

Figure 8:
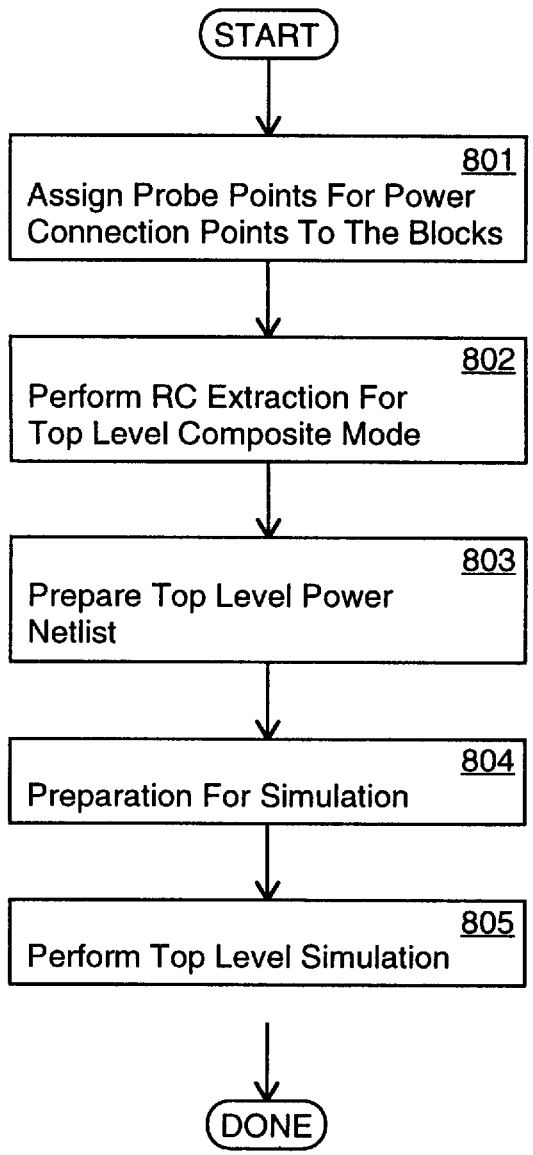
FIG. 8 is a flowchart describing in detail, the steps associated with the full chip simulation stage.

FIG. 8 is a flowchart describing in detail, the steps associated with the full chip simulation netlist preparation stage. The first step 801 of the full chip simulation stage 103 involves assigning probe_points for power connection points to the blocks. In the currently preferred embodiment, a utility known as "top_rail" has been developed to generate the power connection points of all the blocks for the top level extraction according to an input file. The input file (e.g., block_instance file) contains one line description of each block instance. An exemplary format might be: instance_name block_name x y orientation vdd_probe file gnd_probe_file. An example of such an input file might look like: x1 ram1 5709.60 2469.40 0ram1/probe.vdd ram1/probe.vss. The composite power connection points (probe_points) of all the specified blocks are stored in an output file. Next, step 802 performs the actual RC extraction for the top level composite mode. The modeled blocks are represented as black boxes with inputs, functions performed on the inputs, and outputs. The VDD and GND lines terminate at the boundaries of the blocks which are modeled as black boxes (with probe_points assigned). In step 803, the top level power netlist is prepared. As part of step 803, the reduced power network is inserted to the top level power netlist for each block. This can be achieved by using the same "top_rail" utility which inserts a call from the top level .espf file to the awe file for each block instance. The port orders are matched by name. Next, step 804 prepares the blocks for simulation. In the currently preferred embodiment, this is accomplished by attaching em_ipwl commands to the probe_points locations. In other words, the current waveforms (see FIG. 5) are applied to the power connection points of the block instances. The "em_ipwlfile filename instance_name" config command is specified to match the .pwl file of a block to multiple instantiations. If necessary, top level vectors will be applied. Finally, step 805 performs the top level simulation.

Figure 9:
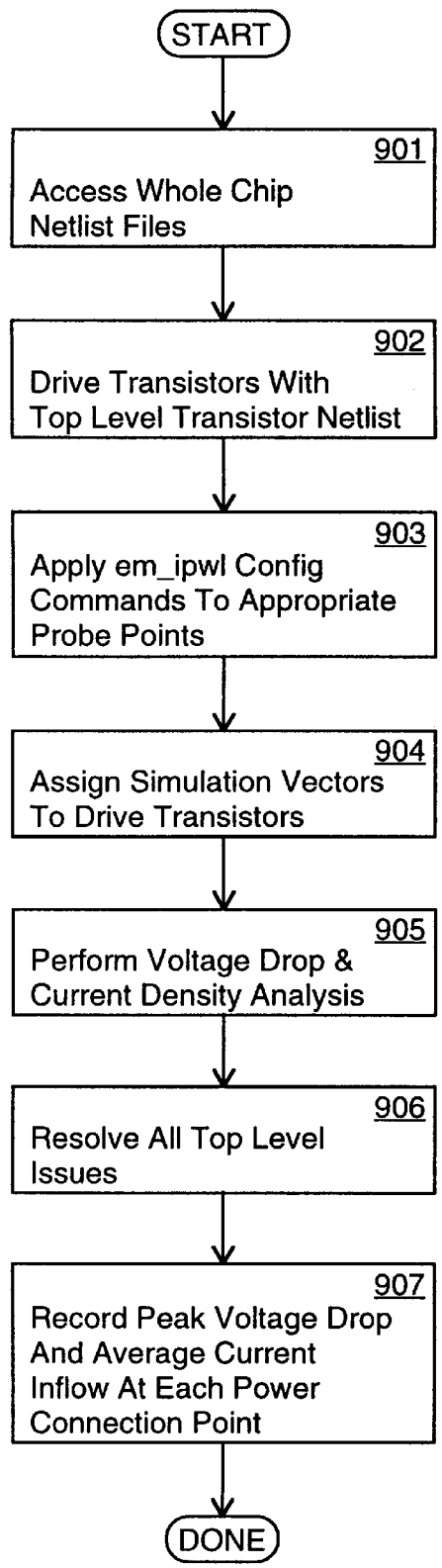
FIG. 9 is a flowchart describing in detail the steps for performing the top level simulation.

FIG. 9 is a flowchart describing in detail the steps for performing the top level simulation. First, the whole chip netlist files (.espf ), including calls to reduced .awe block files, is accessed in step 901. Next, step 902 drives the transistors contained in a top level netlist which also includes the vectors for driving those transistors. There is no need to include the blocks for step 902. In step 903, the em_ipwl config commands are applied to the appropriate probe_points for each block. The simulation vectors are then assigned in step 904 to drive the transistors at the top level. At this point, step 905, the voltage drop and current density analysis can be performed for the top level. Step 906 resolves all top level issues that have been identified. Finally, step 907 records the peak voltage drop and the average current in flow for each power connection points for all of the blocks. It should be noted that steps 902 and 904 are optional.

Figure 10:
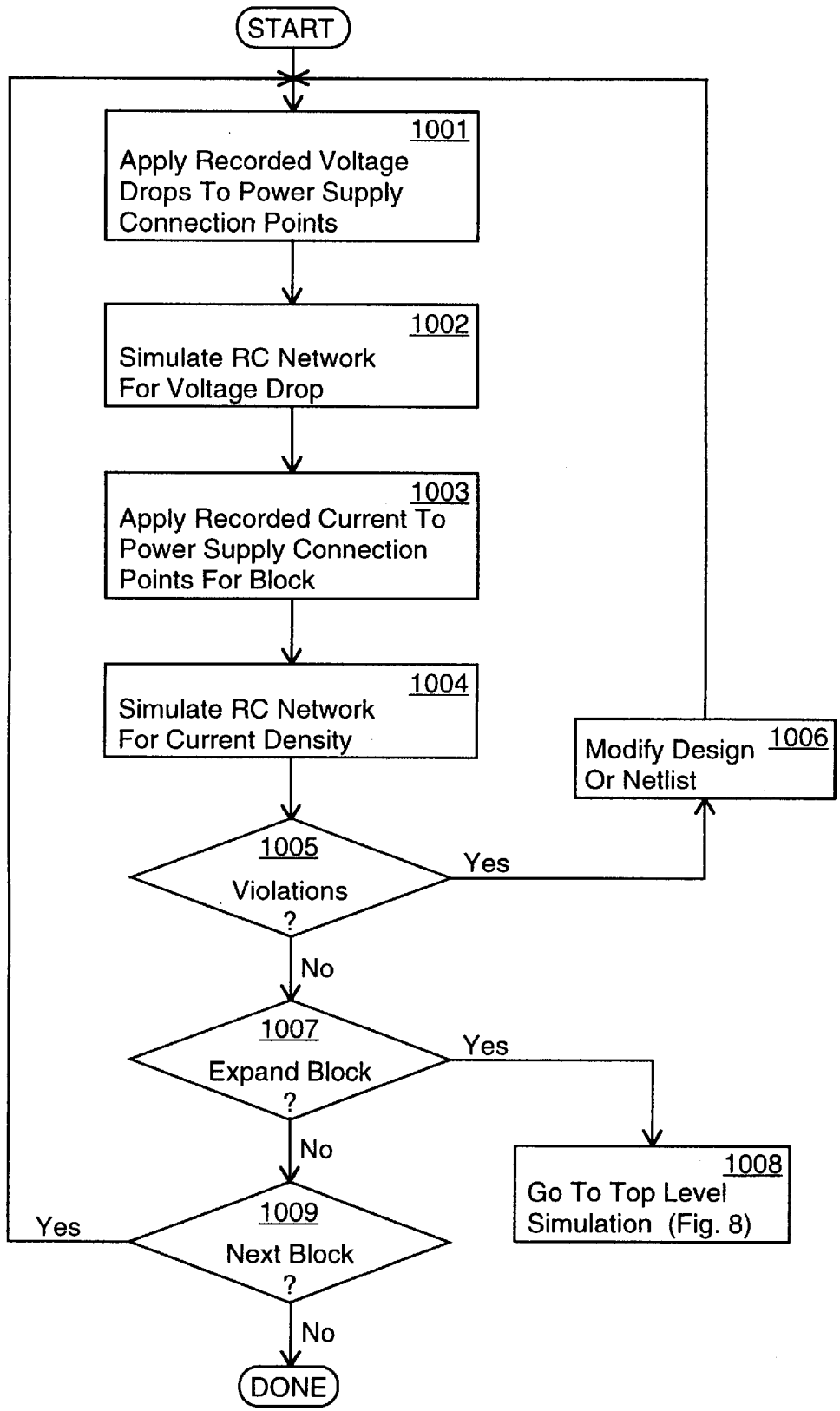
FIG. 10 is a flowchart describing in detail the steps for revisiting the blocks.

FIG. 10 is a flowchart describing in detail the steps for revisiting the blocks. Once the voltage drops for the supplies to the blocks have been determined (step 907), the power supplies to the blocks are adjusted based on this new information and the block is resimulated. This is accomplished by first applying the recorded voltage drops to the power supply connection points for the block and then simulating the RC network for voltage drops, steps 1001 and 1002. Next, the recorded current to the power supply connection points for the block are applied, and the RC network is simulated for current density, steps 1003 and 1004. A determination is then made in step 1005 as to whether there are any voltage drop violations that will be caused by the voltage drop at the block connections. Similarly, the current density at each wire is resimulated with the current flowing into the pads into consideration (calculated in step 907). This may include new voltage drop highlight and/or violation files as well as new current density highlight and/or violation files, which are placed in the directory of that particular block. If there is a violation, the designer can fix the violation by changing either the netlist or layout geometries to modify the design, step 1006. This may include new voltage drop highlight and/or violation files as well as new current density highlight and/or violation files, which are placed in the directory of that particular block. Optionally, the user can choose to expand a block to a transistor level in step 1007. If a block is expanded, the top level simulation is performed (see process of FIG. 8), step 1008. The user may desire to leave the block modeled at the top level. In either case, the number of transistors needs to be consistent with the capacity associated with the workstation running this tool. This process of steps 1001–1008 can be iteratively repeated for each of the blocks, step 1009.

Figure 11:
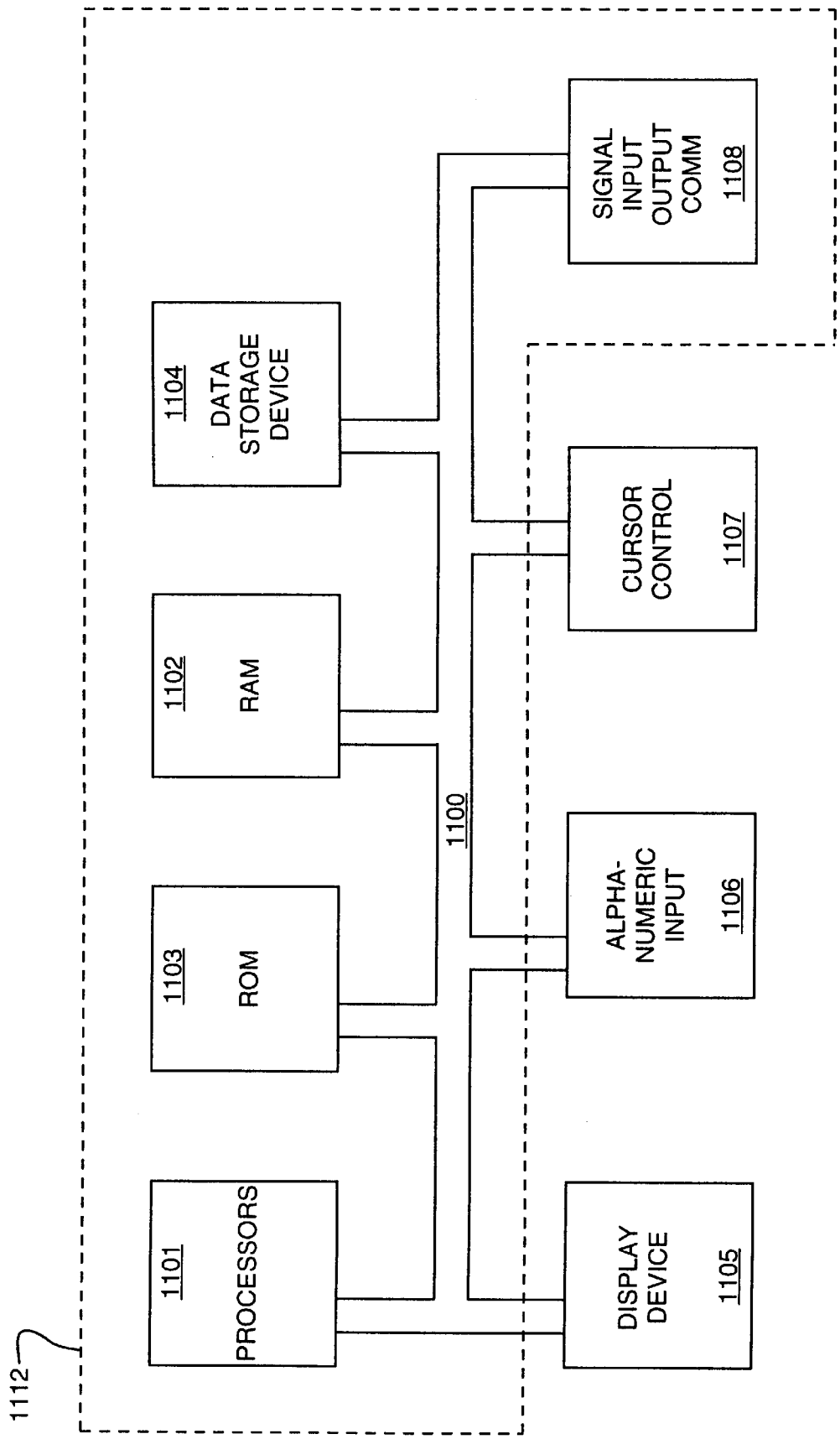
FIG. 11 shows an exemplary computer system (e.g., personal computer, workstation, mainframe, etc.), upon which the present invention may be practiced.

Referring to FIG. 11, an exemplary computer system 1112 (e.g., personal computer, workstation, mainframe, etc.) upon which the present invention may be practiced is shown. The reliability analysis tool to test and simulate the power network of semiconductor chips is operable within computer system 1112. When configured with the simulation and testing procedures of the present invention, system 1112 becomes a computer aided design (CAD) tool 1112, for reliability analysis. The four stages of the present invention described in Figures are implemented within system 1112.

In general, computer systems 1112 used by the preferred embodiment of the present invention comprise a bus 1100 for communicating information, one or more central processors 1101 coupled with the bus for processing information and instructions, a computer readable volatile memory 1102 (e.g., random access memory) coupled with the bus 1100 for storing information and instructions for the central processor 1101. A computer readable read only memory (ROM) 1103 is also coupled with the bus 1100 for storing static information and instructions for the processor 1101. A random access memory (RAM) 1102 is used to store temporary data and instructions. A data storage device 1104 such as a magnetic or optical disk and disk drive coupled with the bus 1100 is used for storing information and instructions. A display device 1105 coupled to the bus 1100 is used for displaying information to the computer user. And an alphanumeric input device 1106 including alphanumeric and function keys is coupled to the bus 1100 for communicating information and command selections to the central processor 1101. A cursor control device 1107 is coupled to the bus for communicating user input information and command selections to the central processor 101, and a signal input/output port 1108 is coupled to the bus 1100 for communicating with a network. The display device 1105 of FIG. 11 utilized with the computer system 1112 of the present invention may be a liquid crystal device, cathode ray tube, or other display device suitable for creating graphic images and alphanumeric characters recognizable to the user. The cursor control device 1107 allows the computer user to dynamically signal the two dimensional movement of a visible symbol (pointer) on a display screen of the display device 1105.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for analyzing a semiconductor chip design, comprising the steps of:
   dividing the semiconductor chip design into a plurality of blocks;
   performing a block level verification based on an assumption that full voltage is being supplied to the blocks;
   modeling the blocks according to a resistor and capacitor network;
   simplifying the resistor and capacitor network into an equivalent circuit;
   determining voltage drops corresponding to the equivalent circuit;
   analyzing the blocks with the voltage being supplied to the blocks reduced according to the determined voltage drops.

2. The method of claim 1, further comprising the steps of:
   identifying probe points corresponding to locations where power is supplied to the blocks;
   obtaining test vectors;
   driving the blocks according to the test vectors;
   capturing currents flowing through the probe points.

3. The method of claim 1, further comprising the step of generating current waveforms as a function of time for one of the blocks.

4. The method of claim 1, further comprising the steps of:
   extracting the resistor and capacitor network;
   performing serial and parallel reductions to the resistor and capacitor network.

5. The method of claim 1, further comprising the steps of:
   calculating peak voltages at a plurality of nodes and average currents flowing through a plurality of wires;
   storing the peak voltages and average currents.

6. The method of claim 1 further comprising the step of performing a top level simulation by:
   accessing a file corresponding to the semiconductor chip;
   identifying transistors of a top level transistor netlist;
   assigning voltage vectors to drive the transistors;
   performing voltage drop and current density analysis;
   resolving top level issues.

7. The method of claim 1 further comprising the step of determining whether the voltage drops result in any violations.

8. The method of claim 1 further comprising the step of expanding one of the blocks to a transistor level, wherein some of the blocks are analyzed at a top level and some blocks are analyzed at the transistor level.

9. A computer-readable medium having stored thereon instructions for causing a computer to implement computer-controlled reliability analysis of a semiconductor chip design, comprising the steps of:
   performing a block level verification, wherein the semiconductor chip design is divided into a plurality of blocks and a full voltage supply is assumed to be input to each power connection point corresponding to the blocks;
   modeling the blocks by equivalent RC networks;
   performing a simulation on the modeled blocks to determine voltage drops and current values;
   analyzing the blocks according to the voltage drops and current values to determine whether there are any performance problems with the chip design.

10. The computer-readable medium of claim 9, wherein the block level verification is comprised of the steps of:
    identifying all blocks which are to be modeled;
    arranging the blocks to be in subdirectories of a circuit directory;
    for each block:
       ensuring that a layout of the block matches that of a schematic representation;
       obtaining vectors to drive the block;
       generating a probe point for a power connection point corresponding to the block;
       extracting an RC network corresponding to the block;
       simulating a voltage drop for the RC network;
       storing a current passing through the power connection point.

11. The computer-readable medium of claim 9, wherein the block level verification is comprised of the steps of:
    calculating a peak voltage for a node of the block;
    calculating an average current flowing through a branch of the block;
    storing the peak voltage and the average current.

12. The computer-readable medium of claim 9, wherein the instructions include the step of reducing the RC network.

13. The computer-readable medium of claim 9, wherein the simulation is comprised of the steps of:
    assigning probe points for power connection points corresponding to the blocks;

performing RC extraction;

preparing a power netlist;

performing a top level simulation, wherein a current waveform is applied to the power connection points of the blocks.

14. The computer-readable medium of claim 9, wherein the analyzing step is comprised of the steps of:

applying a recorded voltage drop to a power supply connection point;

simulating the RC network for the voltage drop;

applying a recorded current to the power supply connection point;

simulating the RC network for current density;

determining whether there are any violations, wherein the design or netlist is changed by the user in response to any violations.

15. The computer-readable medium of claim 14 further comprising the step of expanding one of the blocks to a transistor level and performing the simulation.

16. A computer system for implementing computer-controlled reliability analysis of a semiconductor chip design, comprising:

a memory for storing a netlist and a layout corresponding to a schematic of the semiconductor chip;

a processor coupled to the memory for performing a block level verification, wherein the layout is divided into a plurality of blocks and a full voltage supply is assumed to be input to each power connection point corresponding to the blocks, the processor models the blocks by equivalent RC networks and performs a simulation on the modeled blocks to determine voltage drops and current values, wherein the blocks are analyzed according to the voltage drops and current values to determine whether there are any violations with the chip design;

a display coupled to the processor for displaying the violations.

17. The computer system of claim 16, wherein the block level verification obtain vectors for driving the blocks, generates a probe point for a power connection point corresponding to the block, extracts an RC network corresponding to the block simulates a voltage drop for the RC network, and stores a current passing through the power connection point to the memory.

18. The computer system of claim 16, wherein the processor further calculates a peak voltage of a node and an average current of a branch for storage in the memory.

19. The computer system of claim 16, wherein the processor reduces the RC networks and applies a current waveform to the power connection points of the blocks.

20. The computer system of claim 16, wherein the processor applies a recorded voltage drop to a power supply connection point and simulates the RC network for the voltage drop.

21. The computer system of claim 20, wherein the processor applies a recorded current to the power supply connection point and simulates the RC network for current density to determine whether there are any violations.

22. The computer system of claim 16, wherein the processor expands one of the blocks to a transistor level before performing the simulation.

* * * * *

(12) EX PARTE REEXAMINATION CERTIFICATE (5347th)
United States Patent
Koh et al.

(10) Number: US 5,878,053 C1
(45) Certificate Issued: Apr. 18, 2006

(54) HIERARCHICAL POWER NETWORK SIMULATION AND ANALYSIS TOOL FOR RELIABILITY TESTING OF DEEP SUBMICRON IC DESIGNS

(75) Inventors: Han Young Koh, Fremont, CA (US); Jeh-Fu Tuan, San Jose, CA (US); Tak K. Young, Cupertino, CA (US); Chiping Ju, Saratoga, CA (US); Hurley H. Song, San Jose, CA (US)

(73) Assignee: Synopsys, Inc., Mountain View, CA (US)

Reexamination Request:
No. 90/006,331, Jul. 16, 2002

Reexamination Certificate for:
Patent No.: 5,878,053
Issued: Mar. 2, 1999
Appl. No.: 08/871,086
Filed: Jun. 9, 1997

(51) Int. Cl.
*G01R 31/28* (2006.01)
*G06F 17/50* (2006.01)
*G06F 9/45* (2006.01)

(52) U.S. Cl. .............................. 714/724; 703/18; 716/5
(58) Field of Classification Search .................. 703/18; 714/724; 716/5
See application file for complete search history.

(56) References Cited

U.S. PATENT DOCUMENTS

| | | |
|---|---|---|
| 4,862,399 A | 8/1989 | Freeman |
| 4,907,180 A | 3/1990 | Smith |
| 4,974,173 A | 11/1990 | Stefik et al. |
| 5,119,312 A | 6/1992 | Groger et al. |
| 5,202,841 A | 4/1993 | Tani |
| 5,247,468 A | 9/1993 | Henrichs et al. |
| 5,297,066 A | 3/1994 | Mayes |
| 5,325,309 A | 6/1994 | Halaviati et al. |
| 5,349,542 A | 9/1994 | Brasen et al. |
| 5,379,231 A | 1/1995 | Pillage |

(Continued)

FOREIGN PATENT DOCUMENTS

| | | |
|---|---|---|
| EP | 0 580 920 A1 | 2/1994 |
| JP | 02259975 A | 10/1990 |
| JP | 03211677 A | 9/1991 |
| JP | 07334545 | 12/1995 |
| JP | 0877230 | 3/1996 |
| JP | 08288395 | 11/1996 |
| JP | 0997270 | 4/1997 |
| JP | 09114875 | 5/1997 |

OTHER PUBLICATIONS

Dalal et al.; "Design of an efficient power distribution network for the ultraSPARC–I microprocessor"; IEEE ICCD '95; pp. 118–123; Oct. 1995.*
Yoshitome; "Hierarchical analyzer for VLSI power supply networks based on a new reduction method"; IEEE ICCAD–91; pp. 298–301; Nov. 1991.*
Kerns et al., "Stable and Efficient Reduction of Large, Multiport RC Network by Pole Analysis via Congruence Transformations", 1996.*

(Continued)

*Primary Examiner*—Hugh Jones

(57) ABSTRACT

The present invention pertains to a method for analyzing a semiconductor chip design for determining potential voltage drop and electromigration problems. Initially, the semiconductor chip design is divided into a plurality of blocks. A block level verification is then performed based on the assumption that full voltage is being supplied to each of the blocks. Next, the blocks are modeled by an equivalent RC network. This RC network is then reduced into a simpler representation. The voltage drops are determined based on the reduced, equivalent model. The blocks are then reanalyzed with the supply voltage input to the blocks reduced according to the calculated voltage drops. Thereby, a more realistic simulation can be achieved.

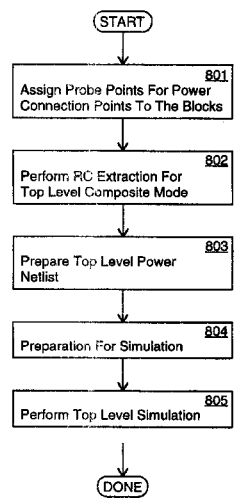

U.S. PATENT DOCUMENTS

| | | | |
|---|---|---|---|
| 5,384,710 A | | 1/1995 | Lam et al. |
| 5,404,310 A | | 4/1995 | Mitsuhashi |
| 5,446,676 A | | 8/1995 | Huang et al. |
| 5,471,409 A | | 11/1995 | Tani |
| 5,481,469 A | | 1/1996 | Brasen et al. |
| 5,490,095 A | | 2/1996 | Shimada et al. |
| 5,533,197 A | | 7/1996 | Moran et al. |
| 5,535,370 A | | 7/1996 | Raman et al. |
| 5,541,849 A | | 7/1996 | Rostoker et al. |
| 5,544,066 A | | 8/1996 | Rostoker et al. |
| 5,553,008 A | | 9/1996 | Huang et al. |
| 5,559,715 A | | 9/1996 | Misheloff |
| 5,572,482 A | * | 11/1996 | Hoshizaki et al. .......... 365/233 |
| 5,592,118 A | | 1/1997 | Wilmot et al. |
| 5,598,348 A | | 1/1997 | Rusu et al. |
| 5,612,636 A | | 3/1997 | Ko |
| 5,648,910 A | | 7/1997 | Ito |
| 5,677,856 A | | 10/1997 | Tani |
| 5,699,283 A | | 12/1997 | Okazaki et al. |
| 5,706,477 A | | 1/1998 | Goto |
| 5,768,145 A | | 6/1998 | Roethig |
| 5,794,008 A | | 8/1998 | Meyers et al. |
| 5,808,896 A | | 9/1998 | Weber |
| 5,870,585 A | | 2/1999 | Stapleton |
| 5,872,952 A | * | 2/1999 | Tuan et al. ................. 395/500 |
| 5,933,358 A | | 8/1999 | Koh et al. |
| 5,960,188 A | | 9/1999 | Linke et al. |
| 6,009,256 A | | 12/1999 | Tseng et al. |
| 6,132,109 A | | 10/2000 | Gregory et al. |
| 6,151,568 A | | 11/2000 | Allen et al. |
| 6,185,723 B1 | | 2/2001 | Burks et al. |
| 6,233,540 B1 | | 5/2001 | Schaumont et al. |
| 6,301,553 B1 | | 10/2001 | Burgun et al. |
| 6,308,143 B1 | | 10/2001 | Segawa |
| 6,389,379 B1 | | 5/2002 | Lin et al. |
| 6,393,385 B1 | | 5/2002 | Pawar et al. |
| 2001/0018647 A1 | | 8/2001 | Weber |

OTHER PUBLICATIONS

PathMill: Transistor–Level Static Timing Analysis, Synpsys, Inc., Copyright Feb. 2000, 2 pages.

RailMill: Power Network Analysis to Assure IC Performance, Synopsys, Copyright Aug. 2000, 3 pages.

PowerMill Power Management and Diagnostics Solution, Synopsys, Copyright Jun. 2000, 5 pages.

TimeMill Dynamic Timing Analysis and Verification, Synopsys, Copyright Jun. 2000, 5 pages.

Arcadia: RC extraction for timing, power, reliability and signal integrity analysis, Synopsis, Copyright Dec. 1999, 2 pages.

Archer Systems, Inc, "ARCADIA User Manual—Advanced RC Analysis and Diagnostic Program" (Feb. 1995).

Al–Hashim, Bashir, "The Art of Simulation Using Pspice Analog and Digital," CRC Press, ISBN 0–8493–7895–8 (1995).

Burch, R., Hall, J, Najm, P., Hocevan, D., Yang, P., and McGraw, M., "A CAD System for Modeling Voltage Drop and Electromigration in VLSI Metallization Patterns," *Texas Instruments Technical Journal*, vol. 5, No. 3, pp 74–84 (May–Jun. 1988).

Bushroe, Dick and Hussain, Asim, "Technology Computer–Aided Design (TCAD) Interconnect Modeling Supplement to the National Technology Roadmap for Semiconductors." Sematech. Technology Transfer 95042800A–TR (Jun. 1, 1995).

Chua, Leon O and Lin, Pen–Min, "Computer–Aided Analysis of Electronic Circuits, Algorithms, and Computational Techniques," Prentice–Hall, Inc. (1975).

Choi, Pyung, "An Equivalent Circuit Structure Macromodel for Analog Phase Locked Loops," Georgia Institute of Technology, *Dissertation Abstracts International*, vol 51/05–B, pp. 2518–2758 (1990), only 2 pages (abstract).

Chowdury, S., "An Automated Design of Minimum–Area IC Power/Ground Nets," *24th ACMI/IEEE Design Automation Conference*. pp 223–229 (1987).

Chowdury, S. and Barkatullah. J S., "Current estimation in MOS IC Logic Circuits," *IEEE International Conference on Computer–Aided Design, ICCAD–88*, pp. 212–215 (Nov. 1988).

Special Report: Design Automation Conference. "Tools for reliability and power analysis reduce risks in submicron design," *Computer Design* (Jun. 1995), 2 pages.

Connelly, J. Alvin and Choi, Pyung, "Macromodeling with SPICE," Prentice–Hall, Inc., ISBN 0–13–544941–3 (1992).

Dahlberg, R., "Technical White Paper on RailMill," Product Marketing Manager. *EPIC Design Technology* (1995).

Dalal, A. Lev, L., and Mitra, S., "Design of an Efficient Power Distribution Network for the UltraSPARC–I™ Microprocessor," *IEEE International Conference on Computer Design*, IEEE Computer Society Press, pp. 118–123 (Oct. 1995).

de Geus, Aort J., "Specs. Simulation Program for Electronic Circuits and Systems" (1984), IEEE, pp. 534–537.

Deng, An Chang. "Power Analysis for CMOS/BiCMOS Circuits," *Workshop Proceedings, International Workshop on Lower–Power Design*, pp. 3–8 (1994).

Deng, A–C., Shrau, Y–C., and Loh, K–H . "Time Domain Current Waveform Simulation of CMOS Circuits," *IEEE International Conference on Computer–Aided Design, ICCAD–88*, pp. 208–211 (Nov. 1988).

Dervisoglu, Bulent I., Ricchetti, Michael. "Component and System Level Design–For–Testability Features Implemented in a Family of Workstation Products". *Hewlett–Packard Journal* (Apr. 1995), pp. 107–118.

Desoer, Charles A and Kuh, Ernest S, "Basic Circuit Theory," McGraw–Hill, Inc., (ISBN 07–016575 (1969), table of contents.

Dharchoudhury, Abhijit; Panda, Rajendran; Blaauw, David; Vaidyanathan, Ravi, "Design and Analysis of Power Distribution Networks in PowerPC™ Microprocessors," Advanced System. Technologies Lab, Proceeding of 35th Design Automation Conference (1998), pp. 738–743.

Dutta, R. and Marek–Sadowska, M., "Automatic Sizing of Power/Ground (P/G) Networks in VLSI", *26th ACM/IEEE Design Automation Conference*. pp. 783–786 (Jun. 1989).

"EPIC Unveiling IC Reliability Tool," Electronic News (May 22, 1995).

"IC Analysis Detects Electromigration and Voltage Drop Before Silicon," *Electronic Design* (Jun. 12, 1995), pp. 64.

"EPIC Tools User Manual," EPIC Design Technology, release 3.4 (1996).

Freeman, R.D , Kang, S.M., Lin–Hendel, C.G., and Newby, M.L., "Automated Extraction of SPICE Circuit Models from Symbolic Gate Matrix Layout with Pruning," *23rd ACM/IEEE Design Automation Conference*, pp. 418–424 (Jun. 1986).

Frost, D F. and Poole, K F , "RELIANT: A Reliability Analysis Tool for VLSI Interconnects," *IEEE Journal of Solid–State Circuits*. vol. 24, No. 2, pp. 458–462 (Apr. 1989).

Goel, Ashok, K., "High–Speed VLSI Interconnections—Modeling, Analysis and Simulation," John Wiley & Sons, Inc , ISBN 0–471–57122–9 (1994), only title page.

Gunn, Lisa, "Software analyses power demands for digital ICs: a design tool calculates power dissipation for each transistor in a CMOS or BiCMOS circuit." *Electronic Design*, vol. 38, No. 8, pp. 129–131 (Apr. 26, 1990).

Hall, J.E. Hocevar, D.E., Yang, P., and McGraw, M.J., "SPIDER—A CAD System for Modeling VLSI Metallization Patterns," *IEEE Transactions in Computer–Aided Design*, vol CAD–6, No. 6, pp. 1023–1031.

Hohol, T.S. and Glasser, L.A., "RELIC: A Reliability Simulator for Integrated Circuits," *IEEE International Conference on Computer–Aided Design, ICCAD–86*, pp 517–520 (Nov. 1986).

Huq, Syed B., "Ease system simulation with IBIS device models," *Electronic Design*, vol. 44, No. 25, pp. 93–100 (Dec. 2, 1996).

Hussain, Syed Zakir. and Overhauser, David, "Automatic Dynamic Mixed–Mode Simulation through Network Reconfiguration," *1995 IEEE International Symposium on Circuits and Systems* (Apr. 30–May 3, 1995), pp. 582–584.

Taylor, Jeffrey, "Epic Design's Software Tools Get Chipmakers Attention." *Investor Business Daily* (May 26, 1995), 1 page.

Ju. Chipping, "Three–Dimensional Simulation for Negative Resistance Characteristics of Parasitic Bipolar Transistor in a Small–Sized Mosfet Structure", International Journal of Commercial Modeling: Electronic Network, Devices and Fields, vol. 8, pp 367–379 (1995).

Kerns, K.J. and Yang, A.T . "Stable and Efficient Reduction of Large, Multiport RC Networks by Pole Analysis via Congruence Transformations." *33rd ACM/ICEE Design Automation Conference*, pp. 280–285 (1996).

Kim, S.Y., Tuncer, F., Gupta, R., Krauter, B , Savatino, T., Neikirk, D.P., Pillage, L.T., "An Efficient Methodology for Extraction and Simulation of Transmission Lines for Application Specific Electronic Modules," *IEEE* (1993), pp. 58–65.

Kriplani, H , Najm, F . and Hajj, I . "Worst Case Voltage Drops in Power and Ground Buses of CMOS VLSI Circuits," (3 pages).

Kriplani, H., "Worst case voltage drops in power and ground buses of CMOS VLSI circuits." Ph.D thesis, University of Illinois at Urbana–Champaign (1994).

Li, P–C. and Young, T., "Electromigration. the time bomb in deep–submicron ICs," *IEEE Spectrum* (Sep. 1996), pp. 75–78.

Liao, H. and Dai, W. W–M , "Partitioning and Reduction of RC Interconnect Networks Based on Scattering Parameter Macromodels," (1995), pp. 704–709.

Liew, B–K., Fang, P., Cheung, N.W., and Hu, C., "Circuit Reliability Simulator for Interconnect. Via, and Contact Electromigration." *IEEE Transactions on Electron Devices*, vol. 39, No. 11, pp. 2472–2479 (Nov. 1992).

Lineback, J. Robert, "Suddenly power dissipation is raising its ugly head", *Electronic Business Buyer*, vol 21. No. 6 (Jun. 1995), pp. 33–37.

Lipman, Jim "Submicron EDA tools help tackle tough designs." *EDN Access* (Jun. 8, 1995), pp. 45–62.

Lipman. Jim "EDA tools let you track and control CMOS power dissipation," *Electronic Design News* (Nov. 23, 1995), pp. 65–66.

Lipman, Jim "Postlayout EDA tools lock onto full–chip verification," *EDN Access* (1996), 8 pages.

1287 Lsim Power Analyst from Mentor Graphics (Jun. 1995), 3 pages.

Mitsuhashi, T and Ku, E.S., "Power and Ground Network Topology Optimization for Cell Based VLSIs," *29th ACM/IEEE Design Automation Conference*. pp 524–529 (Jun. 1992).

Napper. S, "Volt–drop migration tool." *Electronic Engineering Times* (Jun. 5, 1995), 1 pg.

Neale, R. and Mann, D., "Technology Focus. DAC–95 Power distribution nets come of age," *Electronic Engineering* (Jun. 1995).

"Design for reliability," *New Electronics* (Jun. 13, 1995), one page.

Newton, A.R., "The Simulation of Large–Scale Integrated Circuits," Memorandum No. UCB/ERL M78/52. Electronics Research Laboratory, College of Engineering, UC Berkeley (Jul. 1978), R.3 to R.4 pp. 25–29.

Pillage, Lawrence T. and Rohrer, Ronald A . Asymptotic Waveform Evaluation for Timing Analysis, *IEEE Transactions On Computer–Aided Design*, vol 9, No. 4, pp 352–366 (Apr. 1990).

Pillage, Lawrence T., "An Early Introduction to Circuit Simulation Techniques" (1993), pp. 16–19.

Pillage, Lawrence T., Rohrer, Ronald A. and Visweswariah, Chandramouli. "Electronic Circuit System Simulation Methods", McGraw–Hill, Inc., ISBN 0–07–050169–6 (1994).

Pillage, Lawrence T., Rohrer, Ronald A. and Visweswariah, Chandramouli, "Electronic Circuit & System Simulation Methods", 1994.

Rao, Vasant B., Overhauser, David V., Trick, Timothy N., Hajj, Ibrahim N., "Switch–Level Timing Simulation of MOS VLSI Circuits." Kluwer Academic Publishers (1989).

"RailMill Release 3.3," EPIC Design Technology, training material, rev. 0, pp. 1–38.

"RailMill Product Brief," Epic Design Technology.

"RailMill Tutorial," ch 2 (Mar. 24, 1995).

Young, Tak and Hoang. Truong, "RailMill Flow Application Note," EPIC Design Technology (Nov. 14, 1995).

"RailMill™ Improving Reliability in Deep Submicron ICs.".

Ratzlaff, Curtis L., Puellela, Salyamurthy, Pillage, Lawrence T., "Modeling The RC–Interconnect Effects in a Hierarchical Timing Analyzer," *IEEE* (1992), pp. 15.6.1 to 15.6.4.

Rubinstein, Jorge, Penfield, Paul Jr., and Horowitz, Mark A., "Signal Delay in RC Tree Networks," *IEEE Transactions On Computer–Aided Design*, vol. CAD–2, No. 3, pp. 202–211 (Jul. 1983).

Ruehli, A.E, "Circuits Analysis, Simulation and Design", 1987.

Sheu, B.J., Hsu, W.J. and Lee, B.W., "an Integrated–Circuit Reliability Simulator—RELY," *IEEE Journal of Solid–State Circuits*, vol. 24, No. 2, pp. 473–477 (Apr. 1989).

Silvaco International. "Mixed–Mode Simulation Using Smart," vol. 5, No. 2 (Oct. 1994), 6 pages.

Singh, Deo, Rabaey Jan, Pedram, Massoud, Catthoor, Francky, Rajgopal, Suresh. Sehgal, Naresh and Mozdzen. Thomas J., "Power Conscious CAD Tools and Methodologies: A Perspective," *IEEE* (1995), pp. 570–594.

Stanisic, B.R., Verghese, N.K., Rutenbar, R.A., Carley, L.R., Allstot, DJ. "Addressing Substrate Coupling in Mixed–Mode IC's: Simulation and Power Distribution Synthesis," *IEEE Journal of Solid–State Circuits,* vol. 29. No. 3, pp. 226–238 (Mar. 1994).

Stanisic, B.R., Rutebar, R.A., and Carley, L.R., "Mixed–Signal Noise–Decoupling Via Simultaneous Power Distribution Design and Cell Customization in RAIL," *IEEE 1994 Custom Integrated Circuits Conference,* pp 533–536 (May 1994).

Stark, D. and Horowitz, M., "Analyzing CMOS Power Supply Networks using Ariel," *25th ACM/IEEE Design Automation Conference,* pp 460–464 (Jun. 1988).

Stark, D. and Horowitz, M., "Techniques for Calculating Currents and Voltages in VLSI Power Supply Networks," *IEEE Transactions on Computer–Aided Design,* vol. 9, No. 2. pp. 126–132 (Feb. 1990).

Stark, D., "Analysis of power supply networks in VLSI circuits." Ph.D. diss., Stanford University (1991).

Swager, Anne Watson, "DOS–Based analog–simulation software: hands–on project," (May. 21, 1992).

Teng, C–C., Cheng. Y–K.; Rosenbaum, E. and Kang, S–M., "Hierarchical Electromigration Reliability Diagnosis for VLSI Interconnects," *33rd ACM/ICEE Design Automation Conference,* pp 752–757 (Jun. 1996).

Teng, C–C., "Hierarchical Electromigration Reliability Diagnosis for ULSI Interconnects." Ph.D. thesis, University of Illinois at Urbana–Champaign (1996).

Tiwary, G., "Below the half–micron mark," *IEEE Spectrum,* pp. 84–87 (Nov. 1994).

Tuan, J. and Young, T , "Reliability Issues in Power and Ground on Submicron Circuits," *EPIC Design Technology technical paper presented at Wescon/95* (Nov. 1995).

Tyagi, A., "Hercules. A Power Analyzer for MOS VLSI Circuits," *IEEE International Conference on Computer–Aided Design, ICCAD–87.* pp. 530–533 (Nov. 1987).

Weste, Neil II.E., Eshraghian, Kairuan, "Principles of CMOS VLSI Design."

Yoshida, K , "Speed up of an Evaluation Speed 5–15 Times Faster by using Hierarchical Power Supply Netwrok.".

Yoshitome, T., "Hierarchical analyzer for VLSI power supply networks based on a new reduction method." *IEEE International Conference on Computer–Aided Design, ICCAD–91,* pp. 298–301 (Nov. 1991).

* cited by examiner

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 6, 8, 13, 15 and 22 is confirmed.

Claims 1–5, 7, 9–12, 14 and 16–21 are cancelled.

\* \* \* \* \*